(12) United States Patent
Kurd et al.

(10) Patent No.: US 6,922,112 B2
(45) Date of Patent: Jul. 26, 2005

(54) CLOCK SIGNAL GENERATION AND DISTRIBUTION VIA RING OSCILLATORS

(75) Inventors: Nasser A. Kurd, Hillsboro, OR (US); Javed S. Barkatullah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 10/179,861

(22) Filed: Jun. 25, 2002

(65) Prior Publication Data

US 2003/0234694 A1 Dec. 25, 2003

(51) Int. Cl.[7] .............................................. H03B 27/00
(52) U.S. Cl. ...................................... 331/57; 327/295
(58) Field of Search .......................... 331/45, 46, 50, 331/57, 60; 327/291, 295

(56) References Cited

U.S. PATENT DOCUMENTS

| | | | | | |
|---|---|---|---|---|---|
| 6,137,369 | A | * | 10/2000 | Kermani | 331/45 |
| 6,362,694 | B1 | * | 3/2002 | Doberenz | 331/57 |
| 6,493,818 | B2 | * | 12/2002 | Robertson | 712/27 |
| 2001/0011929 | A1 | | 8/2001 | Fairbanks | 331/57 |
| 2002/0003452 | A1 | * | 1/2002 | Mizuno et al. | 331/2 |
| 2002/0171497 | A1 | * | 11/2002 | Forbes | 331/57 |
| 2003/0206068 | A1 | * | 11/2003 | Wong et al. | 331/57 |

FOREIGN PATENT DOCUMENTS

WO   WO 01/67603 A1   9/2001

OTHER PUBLICATIONS

Mizuno, H. & Ishibashi K., "A Noise–Immune GHz–Clock Distribution Scheme using Synchronous Distributed Oscillators", 45th ISSCC 1998 IEEE International, Jul. 2, 1998, pp. 404–405, XP002307841, San Francisco, CA.

Saint–Laurent, M. et al., "A Multi–PLL Clock Distribution Architecture for Gigascale Integration", IEEE, Apr. 19, 2001, pp. 30–35, XP010541753.

Frank O'Mahony, C. Patrick Yue, Mark A. Horowitz and S. Simon Wong, "Design of a 10GHz Clock Distribution Network Using Coupled Standing–Wave Oscillators", Proceedings of the 40th Conference on Design Automation, 2003, pp. 682–687, XP002307842, Anahaim, CA.

* cited by examiner

*Primary Examiner*—Quan Tra
(74) *Attorney, Agent, or Firm*—Buckley, Maschoff & Talwalkar LLC

(57) ABSTRACT

According to some embodiments, a plurality of ring oscillators are associated with a generation and/or distribution of a clock signal.

48 Claims, 19 Drawing Sheets

CLOCK SIGNAL GENERATION AND DISTRIBUTION VIA RING OSCILLATORS

BACKGROUND

A clock signal may be distributed throughout a processor to facilitate the processor's operation. For example, state elements located at different points in the processor die may function synchronously by operating in accordance with the clock signal.

FIG. 1 illustrates a traditional circuit 100 that may be used to distribute a clock signal throughout a processor. A Phase-Locked Loop (PLL) unit 110 synthesizes a high frequency clock signal that is then distributed through a clock distribution "tree." That is, the clock signal reaches a destination 130 by traveling through a path in the tree via a number of inverters 120.

To enable the state elements in the processor to function synchronously together, the tree is designed so that the different paths in the circuit 100 are matched (e.g., the clock signal will pass through the same number of inverters 120 and therefore arrive at each destination 130 at substantially the same time).

A number of problems may arise, however, when a clock signal is distributed via a traditional clock distribution tree. For example, a large processor die and/or a large number of devices may require a lengthy distribution tree. Such a lengthy distribution tree may result clock signal inaccuracies (e.g., a clock signal received at one device may be skewed as compared to a clock signal received at another device). Moreover, a high frequency clock signal may require the use of repeaters in the distribution tree, which can further contribute to clock signal inaccuracies. In addition, small device geometries (e.g., device dimensions) may cause printing inaccuracies that can increase clock signal inaccuracies. Note that any inaccuracies in the clock signal may need to be accounted for in the processor's timing budget (e.g., the inaccuracies may become a significant portion of the clock period and reduce the processor's performance).

Another problem may be associated with an inefficient use of power in a processor. In a traditional clocking system, a fixed frequency is synthesized by a PLL unit from an external reference clock supplied by the system. When the current drawn by the processor suddenly changes, the supply voltage in the core may collapse (i.e., "droop") even though the frequency remains constant as generated by the PLL unit. Therefore, to guarantee functionality in this case, the circuit may be designed to operate at the highest specified frequency and at the lowest potential voltage—even though these droops events may be infrequent. The effect of the voltage droops can be reduced by adding sufficient decoupling capacitors and by using an elevated supply voltage. This approach, however, may waste power and increase the cost of the die.

DETAILED DESCRIPTION

Some of the embodiments described herein are associated with a "clock signal." As used herein, the phrase "clock signal" may refer to any signal that may be used to synchronize the operation of state elements in a processor. A clock signal may comprise, for example, a processor core's global clock signal.

Three Stage Ring Oscillator

Figure 2:
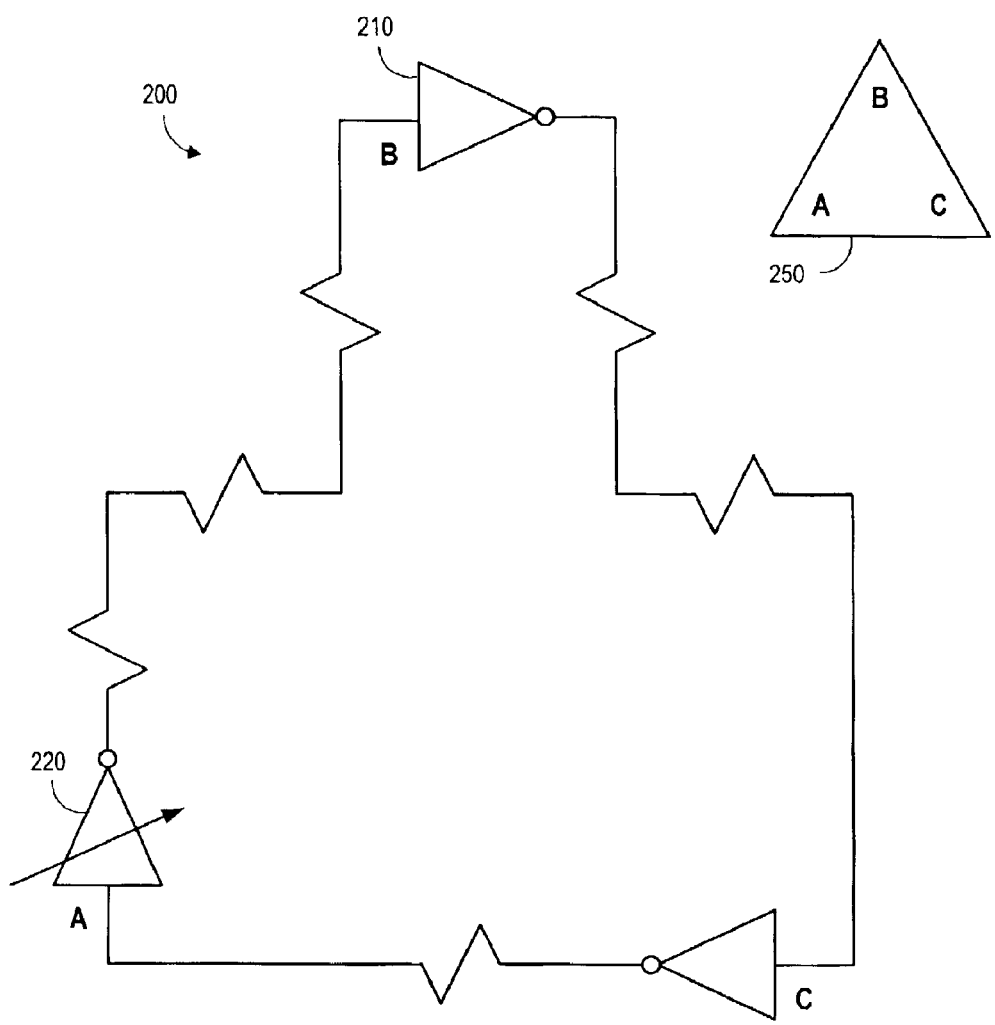
FIG. 2 is a block diagram of a three stage ring oscillator according to some embodiments.

FIG. 2 is a block diagram of a ring oscillator 200 that has three stages (i.e., associated with points "A" through "C"). A symbolic representation 250 of the ring oscillator is also provided.

Each stage of the ring oscillator 200 includes an inverter 210 and an interconnect (i.e., between two inverters 210). The three inverters 210 are arranged in a ring, and the circuit will oscillate because the ring contains an odd number of inverters. In particular, the circuit will oscillate at a frequency $f=1/(2*n*T)$, where n is the number of stages in the ring and T is delay per segment (i.e., including both the inverter 210 and interconnect delays). For example, the ring oscillator 200 might oscillate at 4.5 Gigahertz (GHz). Note that T may vary with a change in temperature or a voltage droop. For example, an increase in temperature or a decrease in voltage may cause T to increase (and the circuit to oscillate at a lower frequency) while a decrease in temperature or an increase in voltage may cause T to decrease (letting the circuit oscillate at a higher frequency).

According to some embodiments, one or more of the stages are associated with a variable delay 220. This may let T be selected (or programmed) such that interconnect delay and the gate delay (i.e., inverter delay) percentages are similar to that of a critical path.

Figure 3:
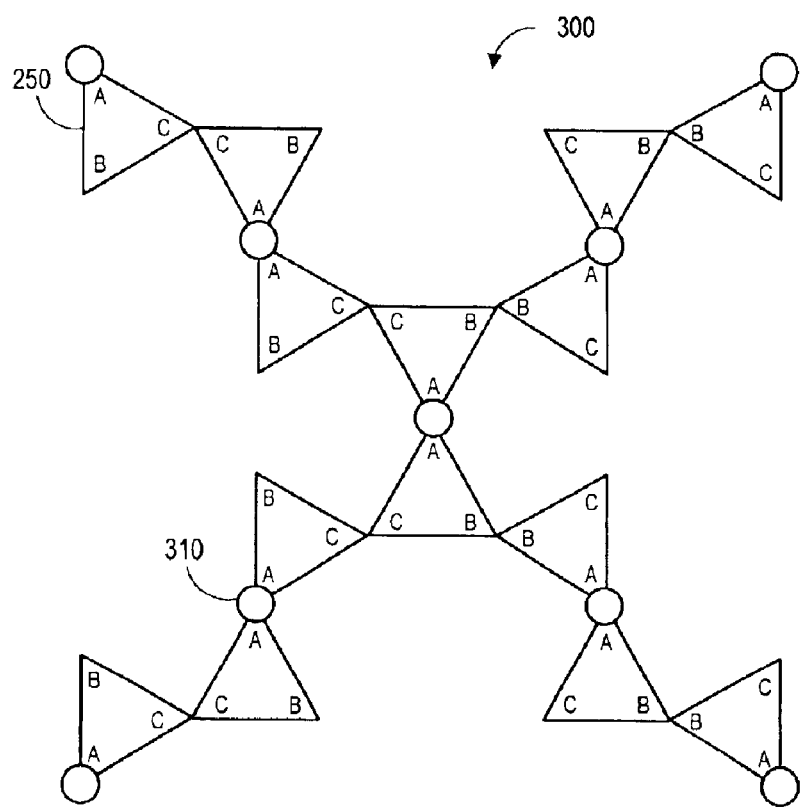
FIG. 3 is a block diagram of a three stage ring oscillator system according to some embodiments.

FIG. 3 is a block diagram of a system 300 having a number of "independent" ring oscillators 250. As used herein, the phrase "independent ring oscillators" means that the circuits do not share a common stage (i.e., each inverter 210 belongs to a single ring oscillator 250).

According to some embodiments, each ring oscillator 250 is "directly shorted" to another ring oscillator 250. As used herein, the phrase "directly" shorted means that no significant phase error is introduced by the shorting element. Although a number of independent ring oscillators 250 are directly shorted according to this embodiment, note that other embodiments may include at least one ring oscillator that is not independent and/or is not directly shorted.

A particular point of one ring oscillator 250 may be directly shorted to a corresponding point of another ring oscillator 250 (e.g., point "A" may be shorted to point "A," point "B" may be shorted to point "B," or point "C" may be shorted to point "C").

The ring oscillators 250 may all oscillate together at substantially the same frequency. That frequency, however, will vary with voltage and/or temperature (e.g., an increase in temperature or a decrease in voltage may cause the circuit to oscillate at a lower frequency). In this way, the ring oscillators 250 may be used to generate an "adaptive" clock signal (i.e., the frequency of the clock signal may adapt to changes in voltage and/or temperature). When the ring oscillators 250 are distributed throughout a substantial portion of a processor die, a change in voltage and/or temperature that affects the entire die will have the largest impact on the clock signal's frequency (as opposed to changes that only effect a portion of the die).

Moreover, the ring oscillators 250 may distribute the clock signal synchronously throughout the processor. For example, the clock signal may be received at a number of different locations 310 throughout the processor die (e.g., locations associated with point "A" of a number of different ring oscillators 250). The distributed clock signal may then be used by state elements.

Five Stage Ring Oscillator

Figure 4:
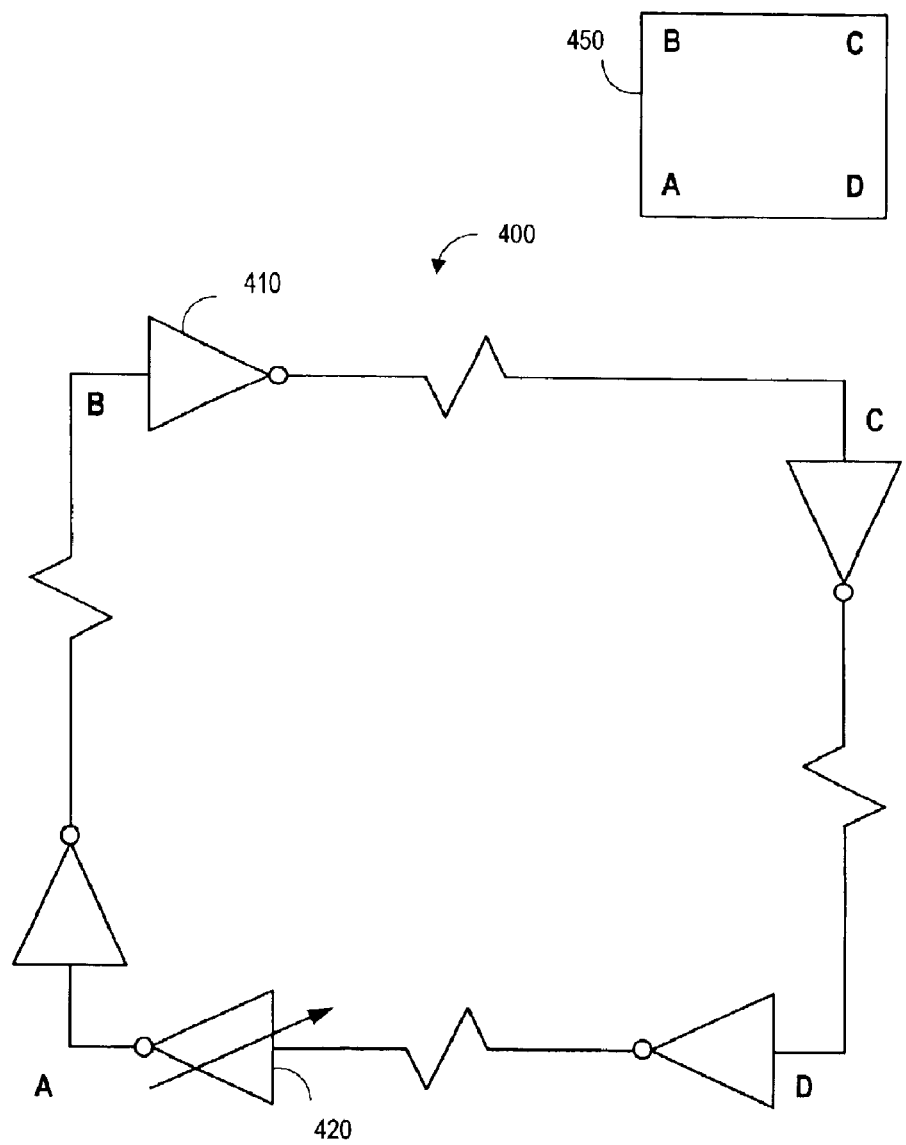
FIG. 4 is a block diagram of a five stage ring oscillator according to another embodiment.

FIG. 4 is a block diagram of a ring oscillator 400 that has five stages. A symbolic representation 450 of the ring oscillator including points "A" through "D" is also provided. As before, each stage of the ring oscillator 400 includes an inverter 410 and an interconnect (and one or more of the inverters may be associated with a variable delay 420). The five inverters 410 are arranged in a ring, causing the circuit to oscillate at a frequency $f=1/(2*n*T)$. For example, the ring oscillator 200 might oscillate at 3 GHz. Note that this ring oscillator 400 may operate at a lower frequency as compared to the ring oscillator 200 illustrated in FIG. 2 (i.e., because n is five instead of three).

Figure 5:
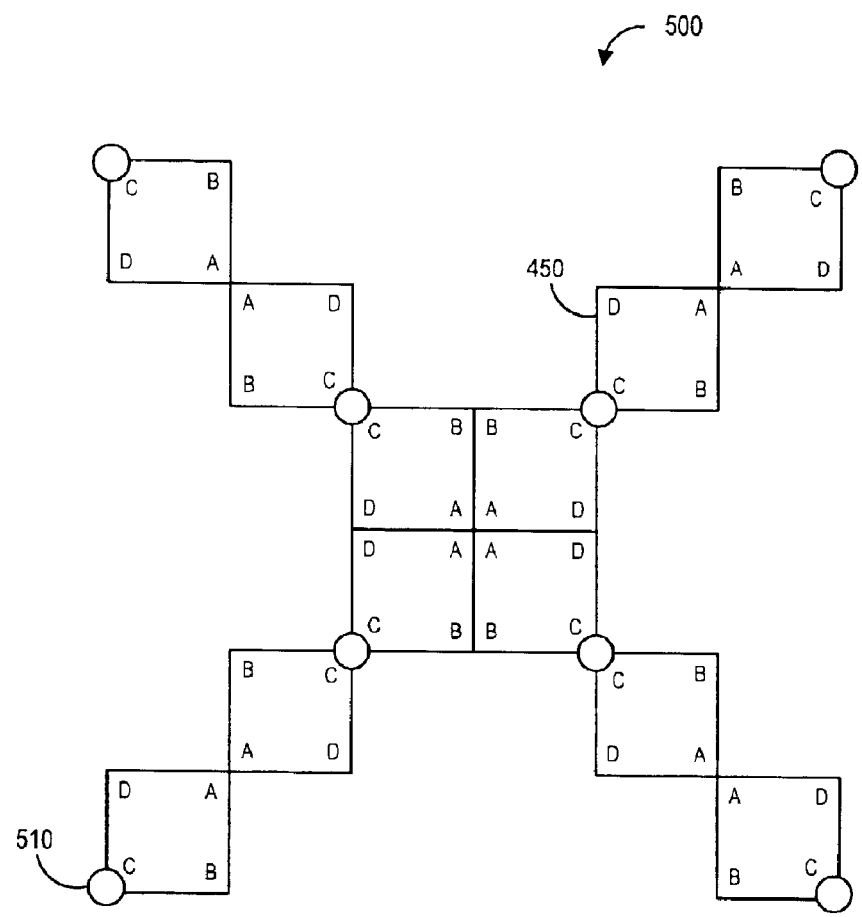
FIG. 5 is a block diagram of a five stage ring oscillator system according to some embodiments.

FIG. 5 is a block diagram of a system 500 that may be used to generate and/or distribute an adaptive clock signal. The circuit includes a number of independent five stage ring oscillators 450, a point of each ring oscillator 450 being directly shorted to a corresponding point of another ring oscillator 450 (e.g., point "C" may be shorted to point "C"). The ring oscillators 450 may all oscillate substantially together to generate a clock signal having a frequency that varies with voltage and/or temperature. In addition, the clock signal may be synchronously received at a number of different locations 510 throughout the processor die (e.g., locations associated with point "C" of a number of different ring oscillators 450).

Clock Signal Method

Figure 6:
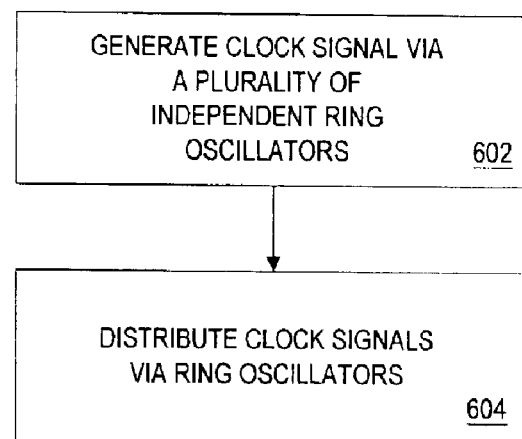
FIG. 6 is a flow chart of a method of facilitating distribution of a clock signal according to some embodiments.

FIG. 6 is a flow chart of a method of facilitating distribution of a clock signal according to some embodiments. The method may be associated with, for example, the three stage ring oscillator circuit 300 illustrated in FIG. 3 or the five stage ring oscillator circuit 500 illustrated in FIG. 5.

At 602, a clock signal is generated via a plurality of independent ring oscillators. Each ring oscillator may have a plurality of stages (e.g., the ring oscillator may include an odd number of inverters), and each ring oscillator may be directly shorted to at least one other ring oscillator.

At 604, the clock signal is distributed via the ring oscillators. For example, the oscillation of the circuit may be used as a clock signal, and the clock signal may be received at various points in the processor die (e.g., from appropriate points in each ring oscillator).

EXAMPLES

Figure 7:
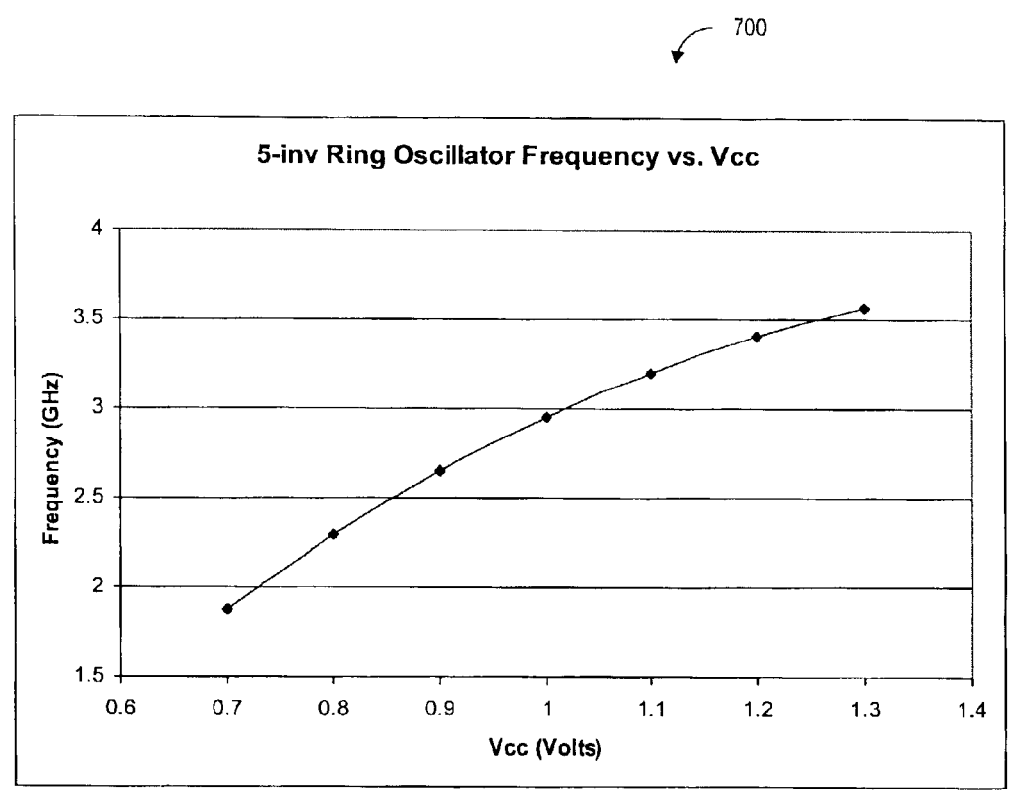
FIG. 7 illustrates a ring oscillator frequency and voltage relationship according to some embodiments.

A ring oscillator (e.g., a three or five stage ring oscillator)—or a plurality of ring oscillators wherein each ring oscillator is directly shorted to at least one other ring oscillator—may operate at a frequency that adapts to a voltage droop and/or a temperature change. FIG. 7 illustrates a ring oscillator frequency and voltage relationship 700 according to some embodiments. This example may be associated with, for example, a five stage ring oscillator 400 wherein T has been selected such that the Resistance Capacitance (RC) interconnect delay is 40% and the gate delay is 60%. As can be seen, a decrease in voltage (i.e., $V_{CC}$) produces a decrease in the frequency of the clock signal. As a result, the processor may normally operate at one frequency and at a another, lower frequency when stressed (e.g., when experiencing a significant voltage droop). Note that a processor may only rarely experience significant voltage droops.

Figure 8:
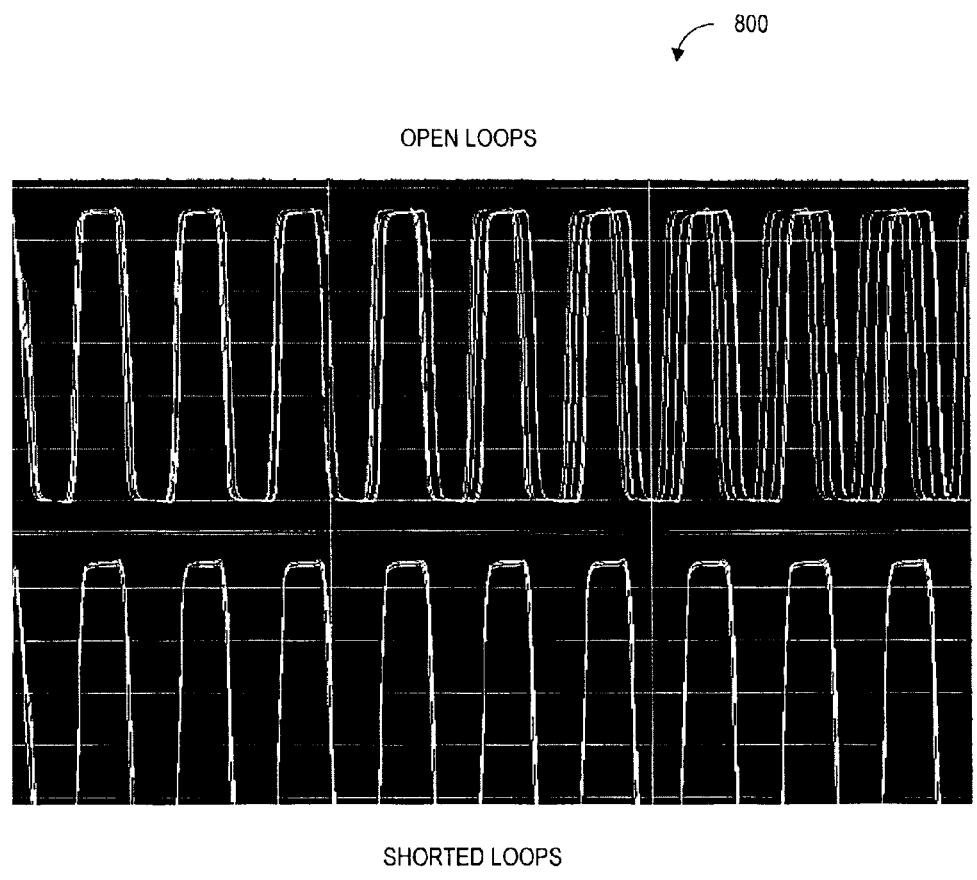
FIG. 8 illustrates clock signals according to some embodiments.

FIG. 8 illustrates clock signals 800 according to some embodiments. Consider a plurality of ring oscillators arranged as illustrated in FIG. 3 or 5—except in this case each ring oscillator is not shorted to any other ring oscillator. That is, a number of substantially similar ring oscillators are operating independently. Note that even "identical" ring oscillators may have slightly different frequencies, which would cause the signals generated by each ring oscillator to drift over time with respect to other ring oscillators. The upper clock signal in FIG. 8 (i.e., "Open Loops") illustrates such a drift. When the ring oscillators are directly shorted to each other, however, this drift may be significantly reduced as illustrated by the lower clock signal in FIG. 8 (i.e., "Shorted Loops").

Figure 9:
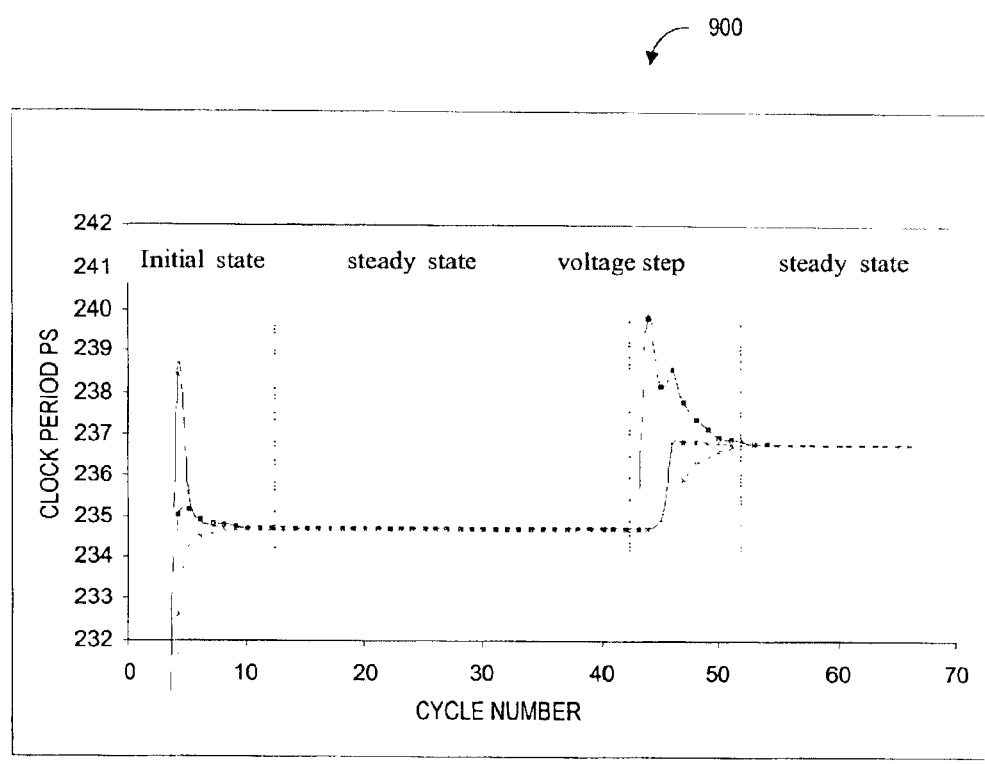
FIGS. 9 and 10 illustrate clock periods according to some embodiments.
Figure 10:
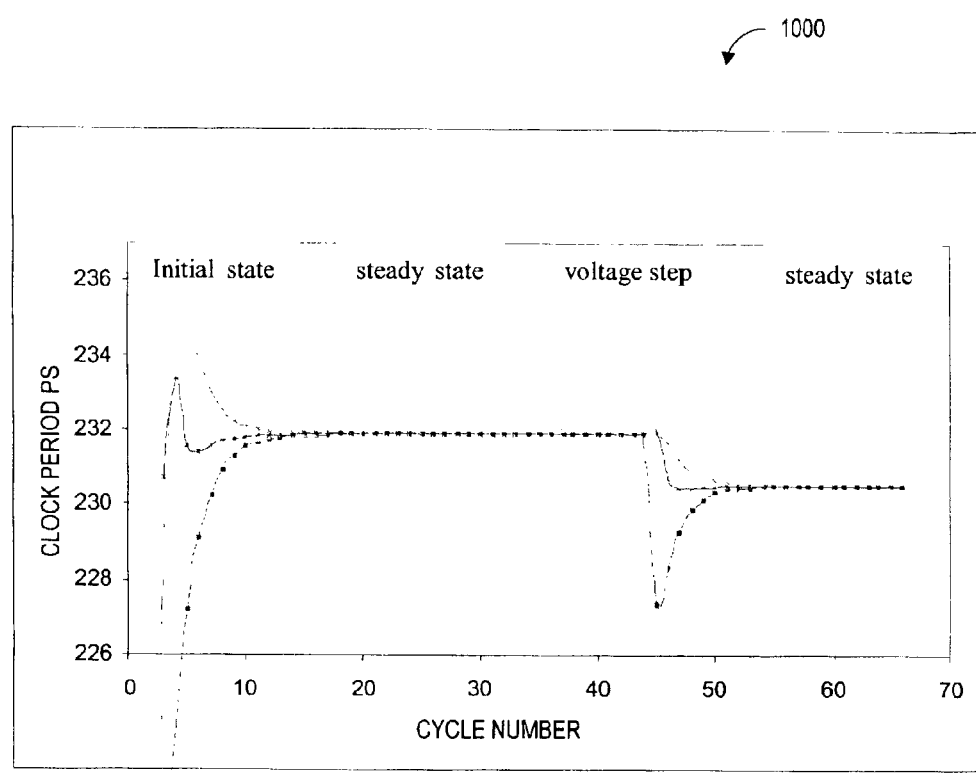

FIGS. 9 and 10 illustrate clock periods 900, 1000 according to some embodiments. In particular, FIG. 9 illustrates what may happen when a voltage step down (i.e., an abrupt decrease in voltage) is applied to a far end of a Ring Oscillator (ROSC) clock generation and distribution circuit (e.g., such as the systems illustrated in FIG. 3 or 5). As can be seen, the frequency of the clock signal adapts by decreasing (i.e., the period of the clock signal increases). Moreover, the ring oscillators quickly reach a steady state (i.e., the circuit does not become unstable). Also note that ring oscillators physically located near the source of the voltage decrease may temporarily experience a slightly more pronounced decrease in clock signal frequency (which may beneficially provide local tracking).

Similarly, FIG. 10 illustrates what may happen when a voltage step up (i.e., an abrupt increase in voltage) is applied to a far end of a ROSC circuit. As can be seen, the frequency of the clock signal adapts by increasing (i.e., the period of the clock signal decreases) and the ring oscillators quickly reach a steady state. In addition, ring oscillators physically located near the source of the voltage increase may temporarily experience a slightly more pronounced increase in clock signal frequency (which again may beneficially provide local tracking).

Figure 11:
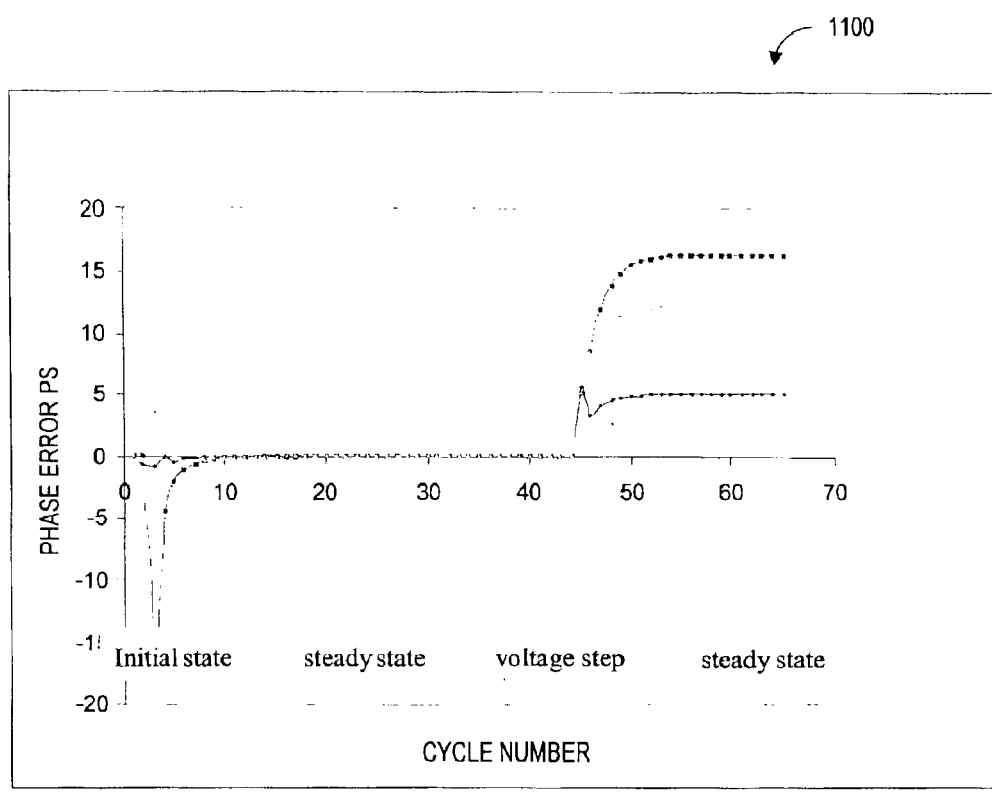
FIGS. 11 and 12 illustrate phase errors according to some embodiments.
Figure 12:
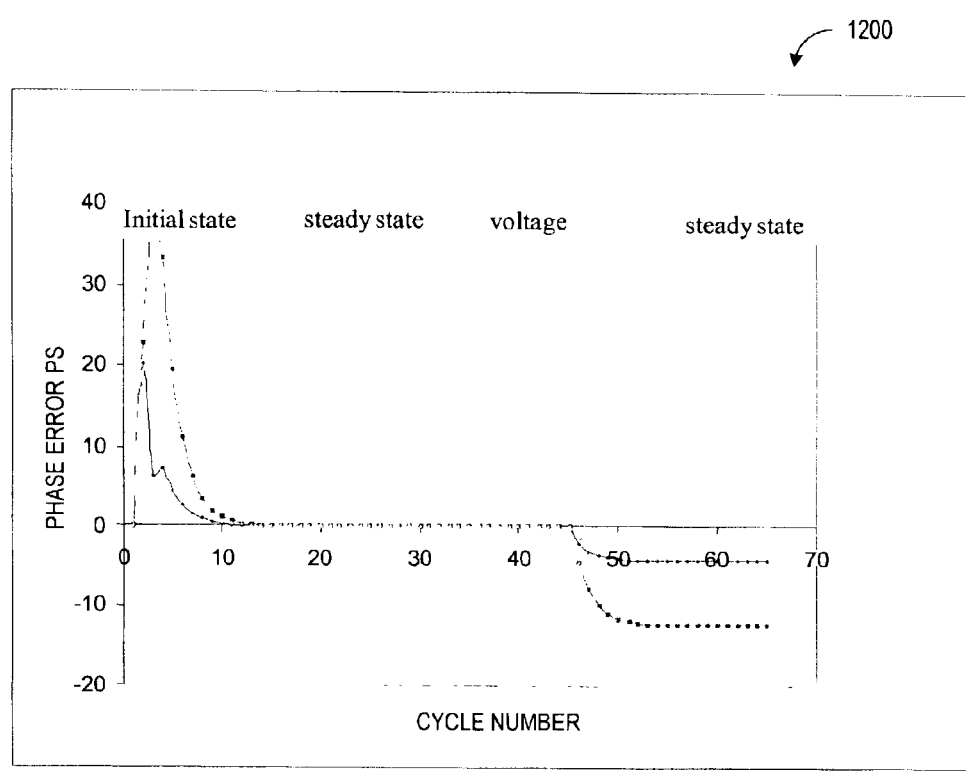

FIGS. 11 and 12 illustrate phase errors 1100, 1200 according to some embodiments. In particular, FIG. 11 illustrates what may happen when a voltage step down is applied, and FIG. 12 illustrates what may happen when a voltage step up is applied to a far end of a ROSC circuit. Note that locations near each other in the processor die may experience similar phase shifts (reducing any phase error between those locations).

Figure 13:
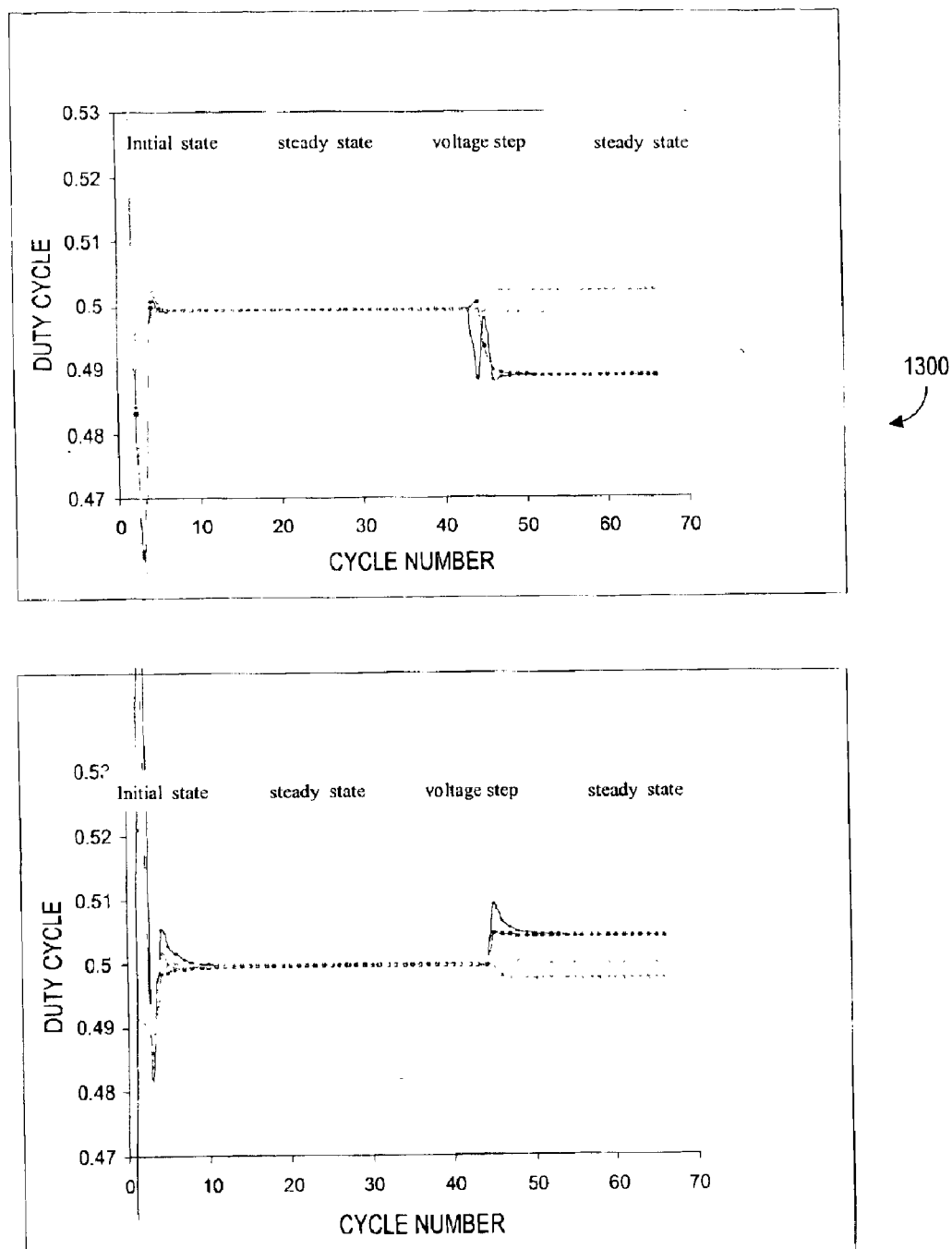
FIG. 13 illustrates duty cycles according to some embodiments.

FIG. 13 illustrates duty cycles 1300 (i.e., as a portion of time that a clock signal is "high" as opposed to "low") according to some embodiments. In particular, FIG. 13 illustrates what may happen when a voltage step (down or up) is applied to a far end of a ROSC circuit. As can be seen, only a slight duty cycle error is introduced.

Detection System

Figure 14:
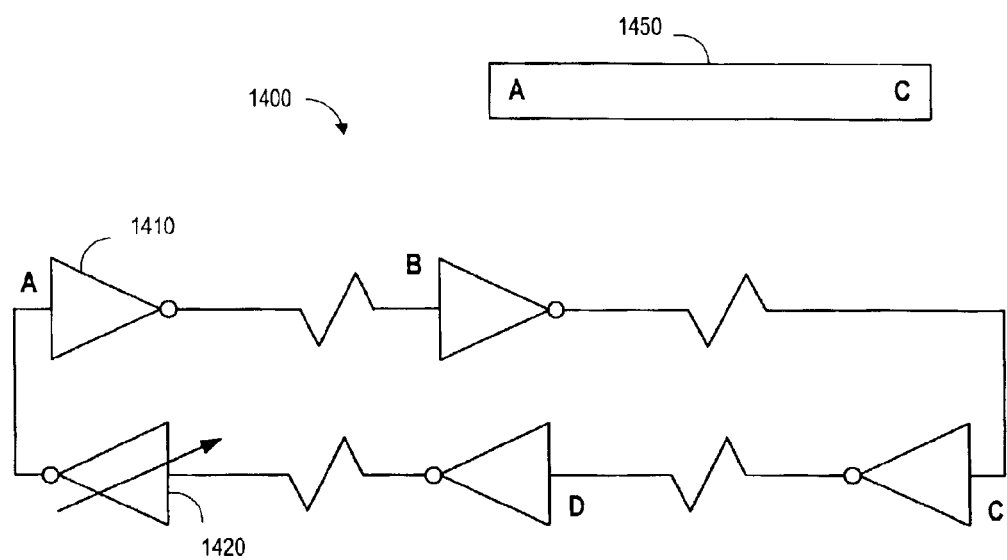
FIG. 14 is a block diagram of a five stage ring oscillator according to another embodiment.

FIG. 14 is a block diagram of a "stick" ring oscillator 1400 according to another embodiment A symbolic representation 1450 including points "A" and "C" is also provided.

As with the circuit illustrated in FIG. 4, each stage of the stick ring oscillator 1400 includes an inverter 1410 and an interconnect (and one or more inverters may be associated with a variable delay 1420). The five inverters 1410 are arranged in a ring, causing the circuit to oscillate at a frequency $f=1/(2*n*T)$. In this case, however, the five ring oscillator stages are arranged substantially in a line (e.g., the stick ring oscillator 1400 occupies area mainly along a single dimension as opposed to two dimensions). Note that a stick ring oscillator 1400 does not necessarily need to have five invertors 1410 (e.g., three invertors may be used instead).

Figure 15:
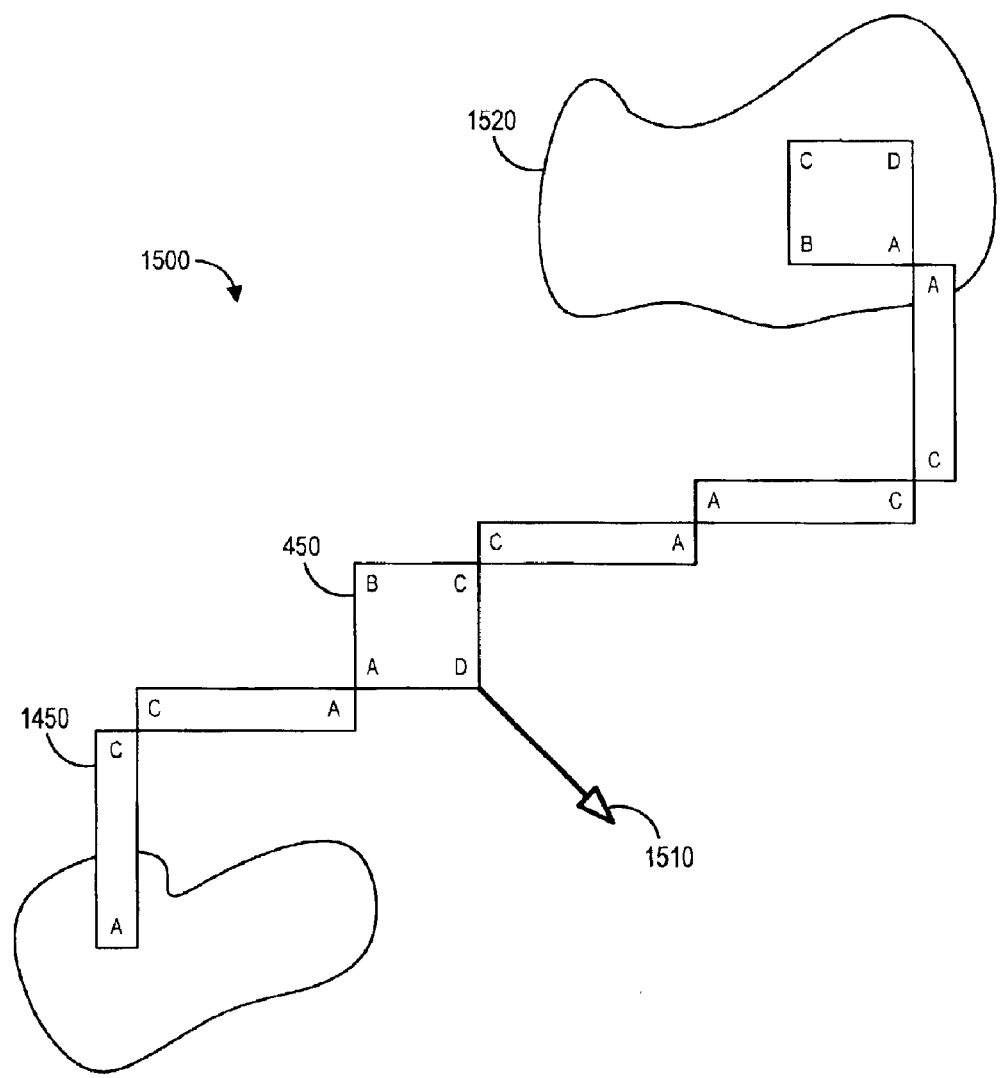
FIG. 15 is a block diagram of a detection system according to some embodiments.

FIG. 15 is a block diagram of a "detection" system 1500 according to some embodiments. As will be explained, the detection system 1500 may be used to facilitate generation of a clock signal (but not distribution of the clock signal). In particular, the detection system 1500 includes a number of square ring oscillators 450 and stick ring oscillators 1450 arranged such that each ring oscillator is shorted to at least one other ring oscillator. In this case, the ring oscillators are arranged to reach critical areas 1520 of the processor die (as opposed to reaching throughout the entire processor die). These areas may be associated with, for example, sensitive state elements and/or portions of the die that are likely to experience significant temperature and/or voltage variations. In this way, the ring oscillators 450, 1450 act to "detect" a condition of the processor die (e.g., the temperature or voltage) by oscillating at an adapted frequency.

Figure 1:
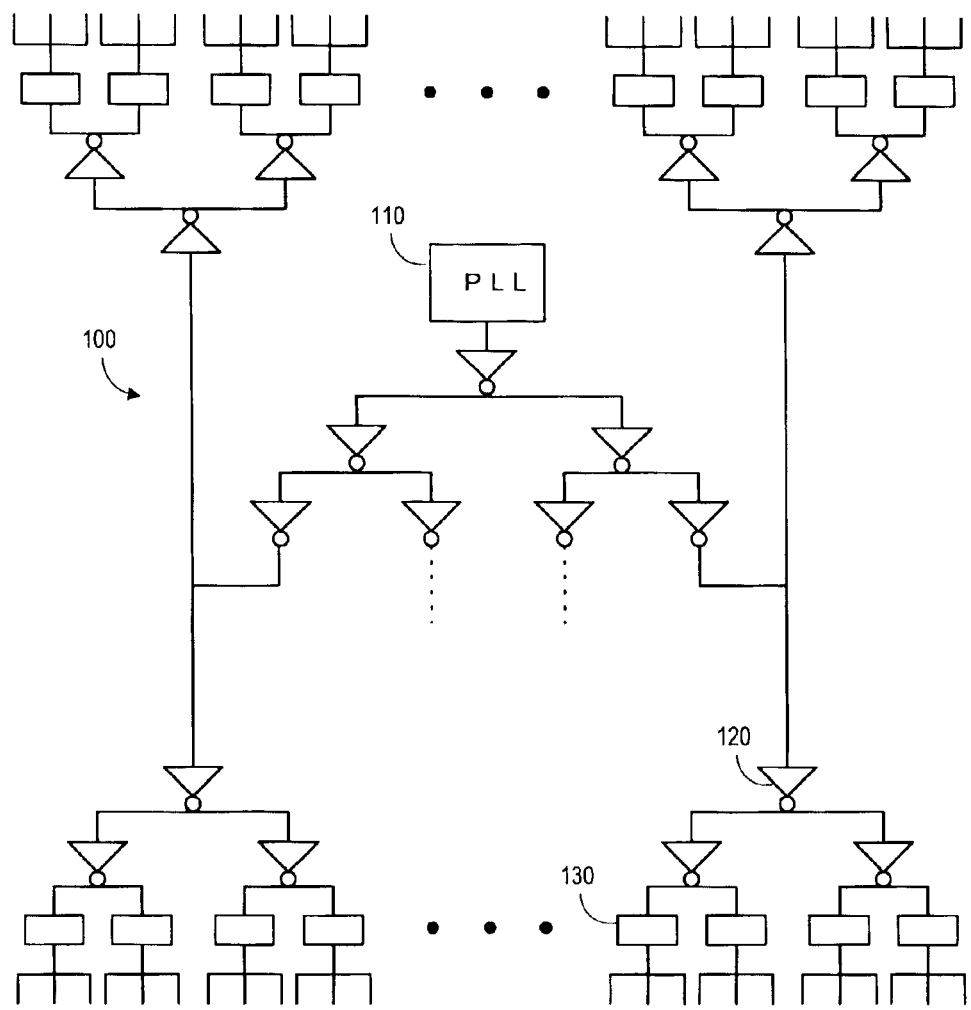
FIG. 1 illustrates a traditional clock distribution circuit.

The oscillating signal 1510 generated by the detection system 1500 may then be distributed throughout the processor die, for example, via a traditional distribution tree circuit (e.g., similar to the one illustrated in FIG. 1).

Integrated Generation and Distribution System

Figure 16:
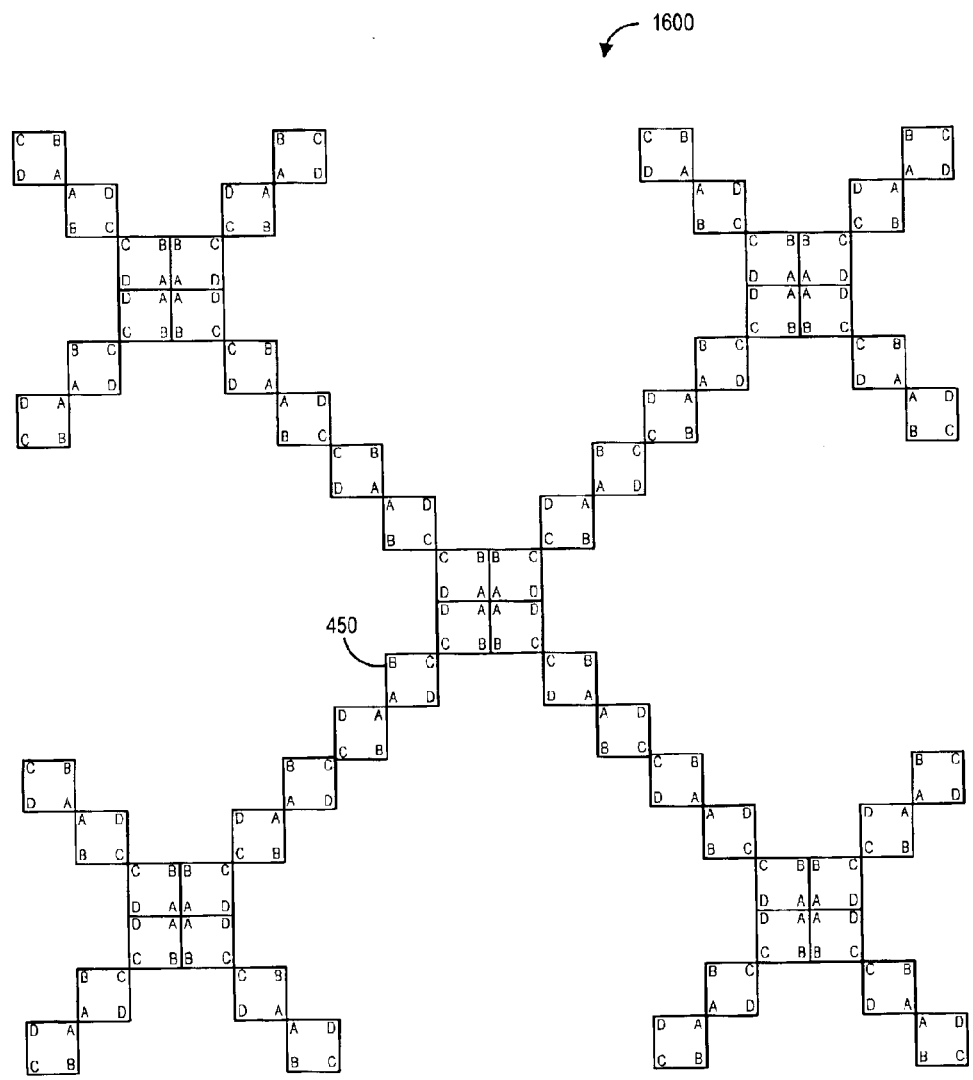
FIG. 16 is a block diagram of a clock signal distribution system according to another embodiment.

FIG. 16 is a block diagram of a clock signal distribution System 1600 having a number of independent ring oscillators 450, each ring oscillator 450 being directly shorted to another ring oscillator 450 (i.e., a point of one ring oscillator 450 is shorted to a corresponding point of another ring oscillator 450). According to this embodiment, the system 1600 is used both to generate and distribute a clock signal having a frequency that will adapt to voltage and/or temperature variations (e.g., an increase in temperature or a decrease in voltage may cause the system 1600 to oscillate at a lower frequency). The clock signal may then be concurrently received by state elements throughout the processor die (e.g., from point "B" of various ring oscillators 450).

Hybrid System

Figure 17:
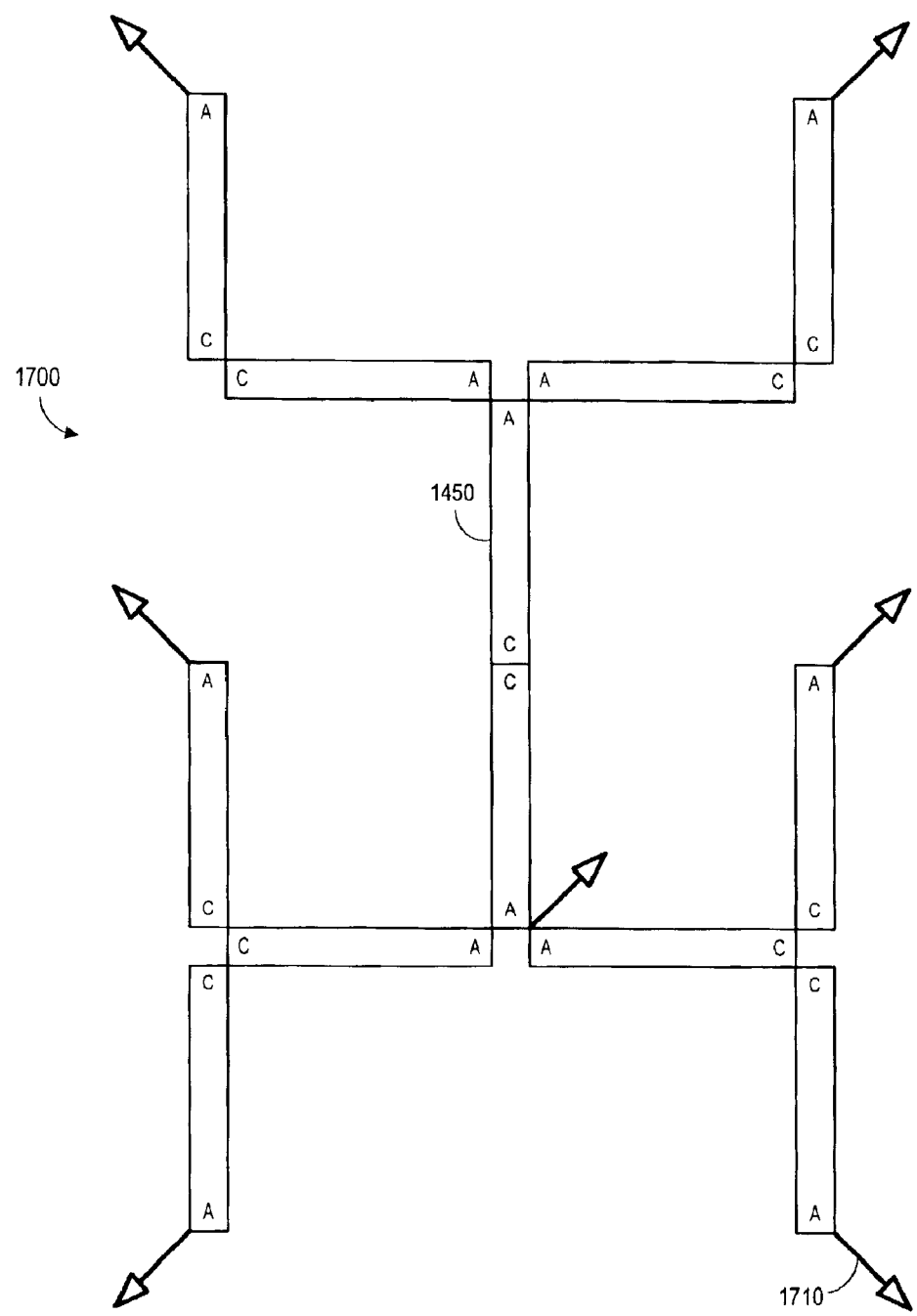
FIG. 17 is a block diagram of a portion of a hybrid ring oscillator and distribution tree system according to still another embodiment.

FIG. 17 is a block diagram of a portion of a "hybrid" ring oscillator and distribution tree system 1700 according to still another embodiment. As will be explained, the hybrid system 1700 may be used to facilitate generation of a clock signal and may also partially distribute the clock signal in the processor. In particular, the detection circuit includes a number of stick ring oscillators 1450 arranged such that each stick ring oscillator 1450 is shorted to a corresponding point of at least one other stick ring oscillator 1450.

A number of oscillating signals 1710 generated by the hybrid system 1700 may then be distributed throughout the processor, for example, through a number of different traditional distribution tree circuits (e.g., each of those circuits being similar to the one illustrated in FIG. 1). Note that in this case, each of the traditional distribution tree circuits may be smaller than would normally be required to distribute the clock signal throughout the processor die (e.g., because the hybrid system 1700 has already partially distributed the clock signal)—thus reducing any inaccuracies introduced by the traditional distribution tree circuits.

Bypass Circuit

Figure 18:
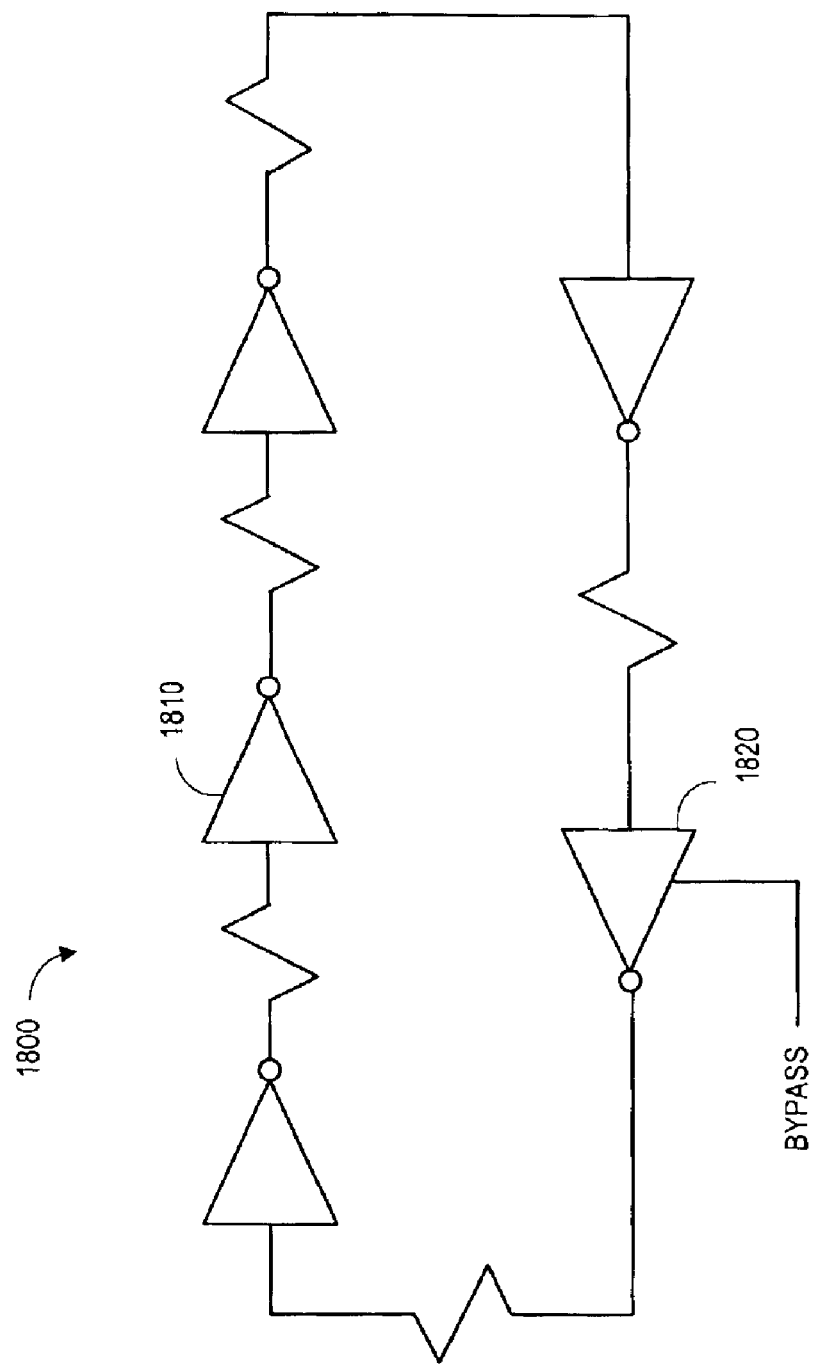
FIG. 18 is a block diagram of a five stage ring oscillator that receives a bypass signal according to another embodiment.

When testing and/or debugging a processor, it may be desirable to operate the processor using a clock signal with a fixed frequency (as opposed to an adaptive frequency). Moreover, it may be desirable to distribute the clock signal via a standard distribution tree. FIG. 18 is a block diagram of a five stage ring oscillator 1800 according to some embodiments. Each stage of the ring oscillator 1800 may include, for example, an inverter 1810 and an interconnect (and one or more inverters may be associated with a variable delay not shown in FIG. 18). The five stages are arranged in a ring, which may cause the circuit to oscillate at a frequency $f=1(2*n*T)$. In this case, however, one or more of the stages may comprise a tri-state buffer 1820 that receives a bypass signal. When the bypass signal is activated, the circuit 1800 may act as a simple gate (instead of a ring oscillator). As a result, a system comprised of a number of such circuits 1800 can either generate a clock signal (when the bypass signal is not activated) or distribute a clock signal in the traditional way (when the bypass signal is activated). In this way, the operation of the processor may be switched between a fixed frequency and an adaptive frequency (e.g., when debugging the processor).

Note that any number of other arrangements besides the one illustrated in FIG. 18 may be used instead.

Clock Signal Domains

Although an adaptive clock signal as described herein may be appropriate for some portions of a processor (e.g., a processor core), other portions may require a fixed clock signal. For example, an Input Output (IO) and synchronization portion of a processor may require a fixed clock signal (e.g., to let the processor communicate with other devices in a system).

Figure 19:
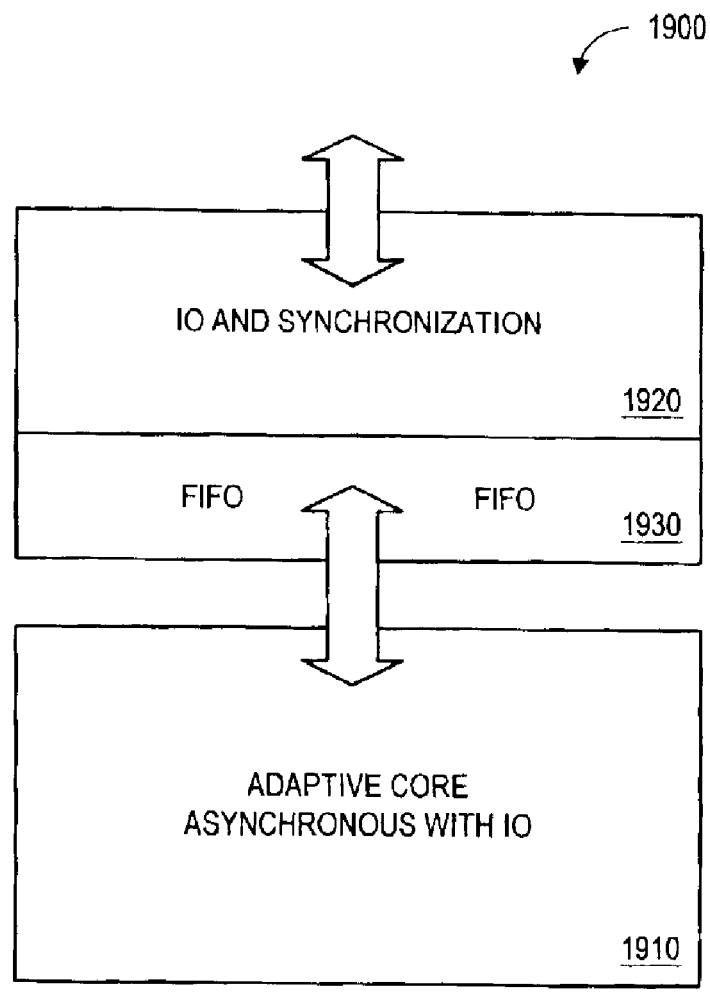
FIG. 19 illustrates domains in a processor according to some embodiments.

FIG. 19 illustrates domains in a processor 1900 according to some embodiments. In particular, the processor 1900 includes a core domain 1910 and an IO domain 1920. According to this embodiment, the clock signal frequency in the core domain 1910 adapts to voltage and temperature variations while the clock signal frequency in the IO domain 1920 does not. That is, the core domain 1910, while itself synchronous, is asynchronous with respect to the IO domain 1920. As a result, a buffer 1930 may be used to facilitate communication between the core domain 1910 and the IO domain 1920. The buffer 1930 may comprise, for example, a First-In, First-Out (FIFO) buffer of appropriate size.

Thus, some embodiments may generate and distribute a low skew, high frequency adaptive clock signal. Moreover, problems caused by sudden demands on current drawn may be reduced along with any requirement for an elevated supply voltage. As a result, the manufacture of low power and cost systems may be facilitated.

ADDITIONAL EMBODIMENTS

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

Although embodiments have been described with respect to particular topologies, any number of other topologies may be used instead (e.g., an "L" shaped ring oscillator may be used).

The several embodiments described herein are solely for the purpose of illustration. Persons skilled in the art will recognize from this description other embodiments may be practiced with modifications and alterations limited only by the claims.

What is claimed is:

1. A circuit, comprising:
   a plurality of independent ring oscillators, each ring oscillator having a plurality of stages, wherein each ring oscillator is directly shorted to at least one other ring oscillator, and wherein any subset of the plurality of ring oscillators is directly shorted to at least one of the other ring oscillators not in the subset;
   a first distribution tree coupled to a node of a first of the ring oscillators, the first distribution tree not including any ring oscillators and having a plurality of branches to distribute a clock signal to state elements in a processor core; and
   a second distribution tree coupled to a node of a second of the ring oscillators, the second ring oscillator not being directly shorted to the first ring oscillator, and the second distribution tree not including any ring oscillators and having a plurality of branches to distribute the clock signal to the state elements.

2. The circuit of claim 1, wherein at least one ring oscillator is to detect a condition of a processor die.

3. The circuit of claim 1, wherein at least one ring oscillator stage is associated with a variable delay.

4. The circuit of claim 1, wherein at least one ring oscillator has three stages, each stage including an inverter and an interconnect.

5. The circuit of claim 1, wherein at least one ring oscillator has five stages, each stage including an inverter and an interconnect.

6. The circuit of claim 1, wherein the ring oscillator stages are arranged substantially in a line.

7. The circuit of claim 1, wherein the ring oscillators are to operate at a frequency that adapts to at least one of: (i) a voltage droop, or (ii) a temperature change.

8. The circuit of claim 1, wherein the ring oscillators are arranged to cover a substantial portion of a processor die.

9. The circuit of claim 1, wherein an input output domain is associated with a synchronous input output clock signal that is asynchronous with respect to a processor core clock signal.

10. The circuit of claim 9, wherein the core and input output domain exchange information via a first-in, first-out buffer.

11. A method, comprising:
    generating a clock signal via a plurality of independent ring oscillators, each ring oscillator having a plurality of stages, wherein each ring oscillator is directly shorted to at least one other ring oscillator and wherein any subset of the plurality of ring oscillators is directly shorted to at least one of the other ring oscillators not in the subset;
    distributing the clock signal to state elements in a processor core via a first distribution tree that is coupled to a node of a first of the ring oscillators, the first distribution tree not including any ring oscillators and having a plurality of branches to distribute the clock signal; and
    distributing the clock signal to state elements in the processor core via a second distribution tree that is coupled to a second of the ring oscillators, the second ring oscillator not being directly shorted to the first ring oscillator, and the second distribution tree not including any ring oscillators and having a plurality of branches to distribute the clock signal.

12. The method of claim 11, wherein at least one ring oscillator detects a condition of a processor die.

13. The method of claim 11, wherein at least one ring oscillator stage is associated with a variable delay.

14. The method of claim 11, wherein at least one ring oscillator has three stages, each stage including an inverter and an interconnect.

15. The method of claim 11, wherein at least one ring oscillator has five stages, each stage including an inverter and an interconnect.

16. The method of claim 11, wherein the ring oscillator stages are arranged substantially in a line.

17. The method of claim 11, wherein the ring oscillators are to operate at a frequency that adapts to at least one of: (i) a voltage droop, or (ii) a temperature change.

18. The method of claim 11, wherein the ring oscillators are arranged to cover a substantial portion of a processor die.

19. The method of claim 11, wherein an input output domain is associated with a synchronous input output clock signal that is asynchronous with respect to a processor core clock signal.

20. The method of claim 19, wherein the core and input output domain exchange information via a first-in, first-out buffer.

21. A circuit, comprising:
    a first ring oscillator having a plurality of stages;
    a second ring oscillator having a plurality of stages independent of the first ring oscillator and being directly shorted to the first ring oscillator;
    a third ring oscillator having a plurality of stages independent of the first and second ring oscillators, the third ring oscillator being directly shorted to the second ring oscillator and not being directly shorted to either (i) the first ring oscillator or (ii) any other ring oscillator in the circuit.

22. The circuit of claim 21, wherein at least one of the ring oscillators is to detect a condition of a processor die.

23. The circuit of claim 21, wherein at least one ring oscillator stage is associated with a variable delay.

24. The circuit of claim 21, wherein at least one ring oscillator has three stages, each stage including an inverter and an interconnect.

25. The circuit of claim 21, wherein the ring oscillator stages are arranged substantially in a line.

26. The circuit of claim 21, wherein the ring oscillators are to operate at a frequency that adapts to at least one of: (i) a voltage droop, or (ii) a temperature change.

27. The circuit of claim 21, wherein the ring oscillators are arranged to cover a substantial portion of a processor die.

28. The circuit of claim 21, wherein an input output domain is associated with a synchronous input output clock signal that is asynchronous with respect to a processor core clock signal.

29. A circuit, comprising:
a plurality of independent ring oscillators, each ring oscillator having a plurality of stages, wherein each ring oscillator is directly shorted to at least one other ring oscillator, and wherein any subset of the plurality of ring oscillators is directly shorted to at least one of the other ring oscillators not in the subset;
a first distribution tree coupled to a first of the ring oscillators; and
a second distribution tree coupled to a second of the ring oscillators, the second ring oscillator not being directly shorted to the first ring oscillator,
wherein (i) the first and second distribution trees do not include ring oscillators and are to distribute a clock signal to state elements in a processor core, and (ii) at least one ring oscillator is adapted to receive a bypass signal such that the ring oscillator acts as a portion of at least one of the first or second distribution trees when the bypass signal is activated.

30. The circuit of claim 29, wherein at least one ring oscillator is to detect a condition of a processor die.

31. The circuit of claim 29, wherein at least one ring oscillator stage is associated with a variable delay.

32. The circuit of claim 29, wherein at least one ring oscillator has three stages, each stage including an inverter and an interconnect.

33. The circuit of claim 29, wherein at least one ring oscillator has five stages, each stage including an inverter and an interconnect.

34. The circuit of claim 29, wherein the ring oscillator stages are arranged substantially in a line.

35. The circuit of claim 29, wherein the ring oscillators are to operate at a frequency that adapts to at least one of: (i) a voltage droop, or (ii) a temperature change.

36. The circuit of claim 29, wherein the ring oscillators are arranged to cover a substantial portion of a processor die.

37. The circuit of claim 29, wherein an input output domain is associated with a synchronous input output clock signal that is asynchronous with respect to a processor core clock signal.

38. The circuit of claim 37, wherein the core and input output domain exchange information via a first-in, first-out buffer.

39. A method, comprising:
generating a clock signal via a plurality of independent ring oscillators, each ring oscillator having a plurality of stages, wherein each ring oscillator is directly shorted to at least one other ring oscillator and wherein any subset of the plurality of ring oscillators is directly shorted to at least one of the other ring oscillators not in the subset;
distributing the clock signal via a first distribution tree that is coupled to a first of the ring oscillators; and
distributing the clock signal via a second distribution tree that is coupled to a second of the ring oscillators, the second ring oscillator not being directly shorted to the first ring oscillator,
wherein (i) the first and second distribution trees do not include ring oscillators and are to distribute the clock signal to state elements in a processor core and (ii) at least one ring oscillator is adapted to receive a bypass signal such that the ring oscillator acts as a portion of at least one of the first or second distribution trees when the bypass signal is activated.

40. The method of claim 39, wherein at least one ring oscillator detects a condition of a processor die.

41. The method of claim 39, wherein at least one ring oscillator stage is associated with a variable delay.

42. The method of claim 39, wherein at least one ring oscillator has three stages, each stage including an inverter and an interconnect.

43. The method of claim 39, wherein at least one ring oscillator has five stages, each stage including an inverter and an interconnect.

44. The method of claim 39, wherein the ring oscillator stages are arranged substantially in a line.

45. The method of claim 39, wherein the ring oscillators are to operate at a frequency that adapts to at least one of: (i) a voltage droop, or (ii) a temperature change.

46. The method of claim 39, wherein the ring oscillators are arranged to cover a substantial portion of a processor die.

47. The method of claim 39, wherein an input output domain is associated with a synchronous input output clock signal that is asynchronous with respect to a processor core clock signal.

48. The method of claim 47, wherein the core and input output domain exchange information via a first-in, first-out buffer.

* * * * *